US011237190B2

(12) United States Patent
Rule et al.

(10) Patent No.: US 11,237,190 B2
(45) Date of Patent: Feb. 1, 2022

(54) AUTOMATIC DETECTION OF LOGICAL PATH SEGMENTS IN A MEASUREMENT POPULATION

(71) Applicant: Tektronix, Inc., Beaverton, OR (US)

(72) Inventors: Keith D. Rule, Beaverton, OR (US); Sean T. Marty, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 94 days.

(21) Appl. No.: 16/734,756

(22) Filed: Jan. 6, 2020

(65) Prior Publication Data

US 2020/0233016 A1 Jul. 23, 2020

Related U.S. Application Data

(60) Provisional application No. 62/794,967, filed on Jan. 21, 2019.

(51) Int. Cl.
*G01R 13/28* (2006.01)

(52) U.S. Cl.
CPC ................... *G01R 13/28* (2013.01)

(58) Field of Classification Search
CPC . G09G 3/3466; G02F 1/13725; G06F 3/1431; G06F 3/1446; G06F 3/147; G06F 13/385; G06F 3/04842; G01R 31/3177; G01R 13/029; G01R 31/2853; G01R 31/31705; G01R 31/3171; G01R 13/345; G01R 19/2506; G01R 13/0236; G01R 1/025; G01R 31/3191; G01R 31/30; G01R 31/31711; G01R 31/31937; G01R 13/28; G01R 35/00; G01R 35/002; G01R 13/325; G11B 19/04; G11B 20/10009; G11B 20/10296; G11B 27/36; G01D 18/00; G06K 9/6218

See application file for complete search history.

(56) References Cited

U.S. PATENT DOCUMENTS

| | | | | |
|---|---|---|---|---|
| 5,397,981 A * | 3/1995 | Wiggers | ............... | G01R 13/24 324/121 R |
| 5,790,133 A * | 8/1998 | Holcomb | ............... | G01R 13/20 345/501 |
| 6,989,833 B2 * | 1/2006 | Narita | ............... | G01R 13/0227 345/208 |
| 7,401,007 B1 * | 7/2008 | Su | ............... | G01R 19/2509 324/76.11 |
| 7,650,249 B2 * | 1/2010 | Wegener | ............... | H03M 7/30 702/66 |

(Continued)

*Primary Examiner* — Vinh P Nguyen
(74) *Attorney, Agent, or Firm* — Miller Nash LLP; Andrew J. Harrington

(57) ABSTRACT

A test and measurement instrument, including a memory configured to store a waveform data record; one or more processors, and a display. The one or more processors are configured to receive the waveform data record, determine a measurement value and location for a plurality of occurrences of a measurement event in the waveform data record, detect one or more logical path segments in the plurality of occurrences, and generating a visual representation of each measurement value and overlaying each of the visual representations of each measurement value. The visual representations of each measurement value and/or the one or more logical path segments may be displayed on the display.

20 Claims, 18 Drawing Sheets

(56) References Cited

U.S. PATENT DOCUMENTS

| | | | | |
|---|---|---|---|---|
| 7,889,198 B2* | 2/2011 | Nara | ................ | G01R 13/029 |
| | | | | 345/440 |
| 8,055,464 B2* | 11/2011 | Rule | ................ | G01R 13/029 |
| | | | | 702/68 |
| 9,442,136 B2* | 9/2016 | Duff | ................ | G01R 13/0236 |
| 9,459,290 B2* | 10/2016 | Johnson | ............ | G01R 13/0236 |
| 9,989,559 B2* | 6/2018 | Rule | ................ | G01R 13/0254 |

* cited by examiner

AUTOMATIC DETECTION OF LOGICAL PATH SEGMENTS IN A MEASUREMENT POPULATION

PRIORITY

This disclosure claims benefit of U.S. Provisional Application No. 62/794,967, titled "INTERACTIVE INSTRUMENT MEASUREMENT ANALYTICS," filed on Jan. 21, 2019, which is incorporated herein by reference in its entirety.

FIELD OF THE INVENTION

This disclosure is directed to systems and methods related to test and measurement systems, and in particular, to generating measurement populations from a waveform data record and automatically detecting logical path segments within the measurement populations.

BACKGROUND

Normally, measurements in test and measurement instruments, such as oscilloscopes, are presented as black-box results. This results in a user being unable to easily review the measurement to determine a potential cause of any error or abnormal result. When measurements and/or results make sense to a user, this is not an issue. However, if the measurements and/or results look abnormal to a user, then a user is left trying to debug their device under test without any further information from the test and measurement instrument on why the result may be abnormal.

Conventional test and measurement instruments typically only perform one measurement on a waveform. If a user wanted to see the source of the measurement, a user would look for the first occurrence in the waveform or turn on measurement annotations. However, in modern test and measurement instruments, measurements are made on all occurrences of a waveform, and the test and measurement instrument may output measurement statics and a histogram. If a result is unexpected, it can be more difficult to figure out why the measurement is unexpected.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
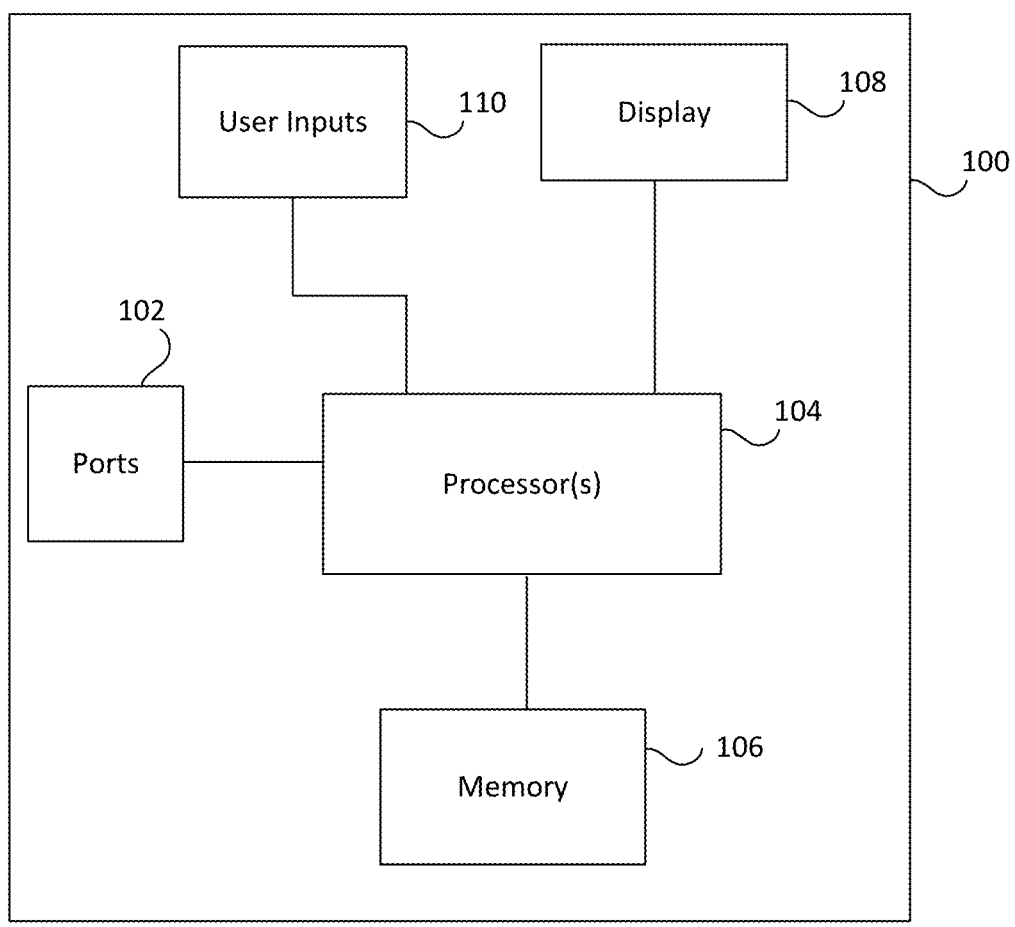
FIG. 1 is a block diagram of an example test and measurement instrument according to embodiments of the disclosure.

FIG. 1 is a block diagram of an example test and measurement instrument 100, such as an oscilloscope, for implementing embodiments of the disclosure disclosed herein. The test and measurement instrument 100 may include one or more ports 102 which may be any electrical signaling medium. Ports 102 may include receivers, transmitters, and/or transceivers. Each port 102 is a channel of the test and measurement instrument 100. The ports 102 can be coupled with one or more processors 104 to process the signals and/or waveforms received at the ports 102 from one or more devices under test. Although only one processor 104 is shown in FIG. 1 for ease of illustration, as will be understood by one skilled in the art, multiple processors 104 of varying types may be used in combination, rather than a single processor 104.

The ports 102 can also be connected to a measurement unit in the test and measurement instrument 100, which is not depicted for ease of illustration. Such a measurement unit can include any component capable of measuring aspects (e.g., voltage, amperage, amplitude, etc.) of a signal received via ports 102. The test and measurement instrument may include additional hardware and/or processors, such as conditioning circuits, an analog to digital converter, and/or other circuitry to convert a received signal to a waveform for further analysis. The resulting waveform can then be stored in a memory 106, as well as displayed on a display 108.

The one or more processors 104 may be configured to execute instructions from memory 106 and may perform any methods and/or associated steps indicated by such instructions, such as, but not limited to, displaying measurement results and automatically identifying common waveform paths, overlaying the waveform paths selected from a measurement population, filtering waveform paths, and generating and displaying histogram comparisons between an original and sub elements of a measurement. Memory 106 may be implemented as processor cache, random access memory (RAM), read only memory (ROM), solid state memory, hard disk drive(s), or any other memory type. Memory 106 may also act as a medium for storing data, computer program products, and other instructions. For example, in some embodiments, waveform data, such as a waveform record which may be obtained through ports 102 and/or the measurement unit and may be stored in memory 106. The waveform data record may then be input to the one or more processors 104 from the memory 106.

User inputs 110 are coupled to the one or more processors 104. User inputs 110 may include a keyboard, mouse, trackball, touchscreen, and/or any other controls employable by a user to interact with a GUI on the display 108. The display 108 may be a digital screen, a cathode ray tube based display, or any other monitor to display waveforms, measurements, and other data to a user. While the components of the test and measurement instrument 100 are depicted as being integrated within test and measurement instrument 100, it will be appreciated by a person of ordinary skill in the art that any of these components can be external to test and measurement instrument 100 and can be coupled to test and measurement instrument 100 in any conventional manner (e.g., wired and/or wireless communication media and/or mechanisms). For example, the display 108 may be remote from the test and measurement instrument 100.

In some embodiments, the one or more processors 104 may receive a waveform data record from the memory 106 or a remote device. The one or more processors 104, through the measurement unit, for example, may perform a measurement on the waveform data record. For example, the one or more processors 104 may perform a rising edge measurement, a falling edge measurement, a rising and falling edge measurement, an edge measurement, a long bit measurement, or any custom measurement set by a user. Using these measurements, the one or more processors 104 may create and instruct the display 108 to display a histogram.

Figure 2:
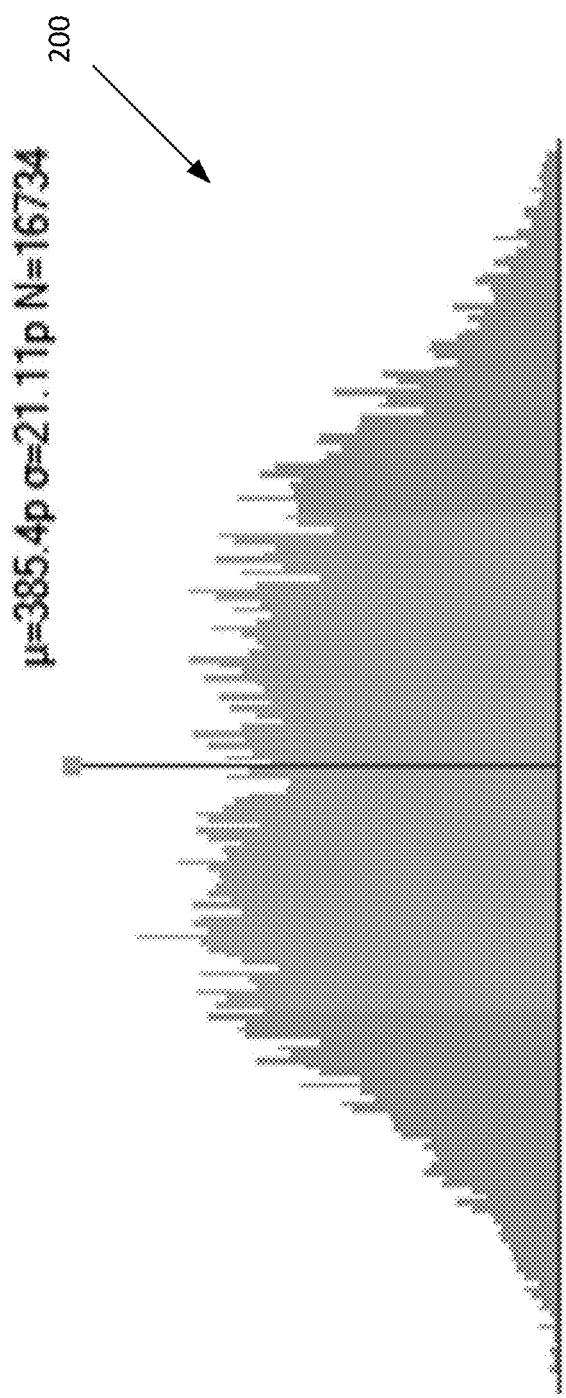
FIG. 2 is an example of a histogram for a rising edge waveform measurement.

For example, FIG. 2 illustrates an example of a histogram 200 which may be produced based on a rising edge measurement of a waveform data record. If a user was expecting a more normal distribution for the rising edge measurement, the user may be surprised by the resulting histogram 200. Embodiments of the disclosure, as discussed in further detail below, will allow a user to get a better understanding of what is occurring in their measurement.

Based on the measurement, the one or more processors 104 can generate a measurement population, which can visually depict as waveform segments the measurements shown in the histogram 200. The measurement population can include overlaying the various waveform segment paths associated with the measurements. This process may be similar, for example, to how an eye diagram is constructed.

Figure 3:
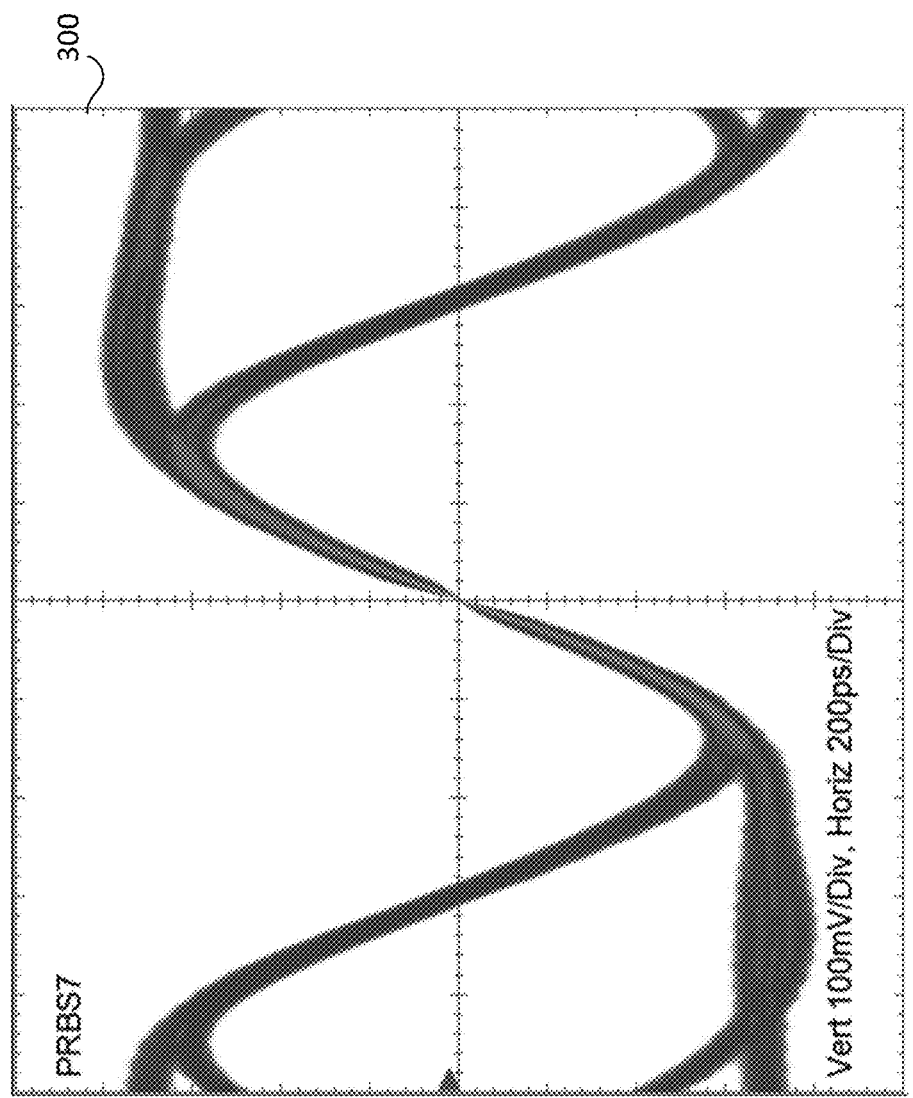
FIG. 3 is an example of multiple overlaid rising edge measurements displayed in a graticule according to embodiments of the disclosure.

That is, embodiments of the disclosure, as will be discussed in more detail below, can generate the measurement population 300 by overlaying each of rising edge measurements as waveform segments, as seen in FIG. 3, and which can be displayed on display 108.

Figure 4:
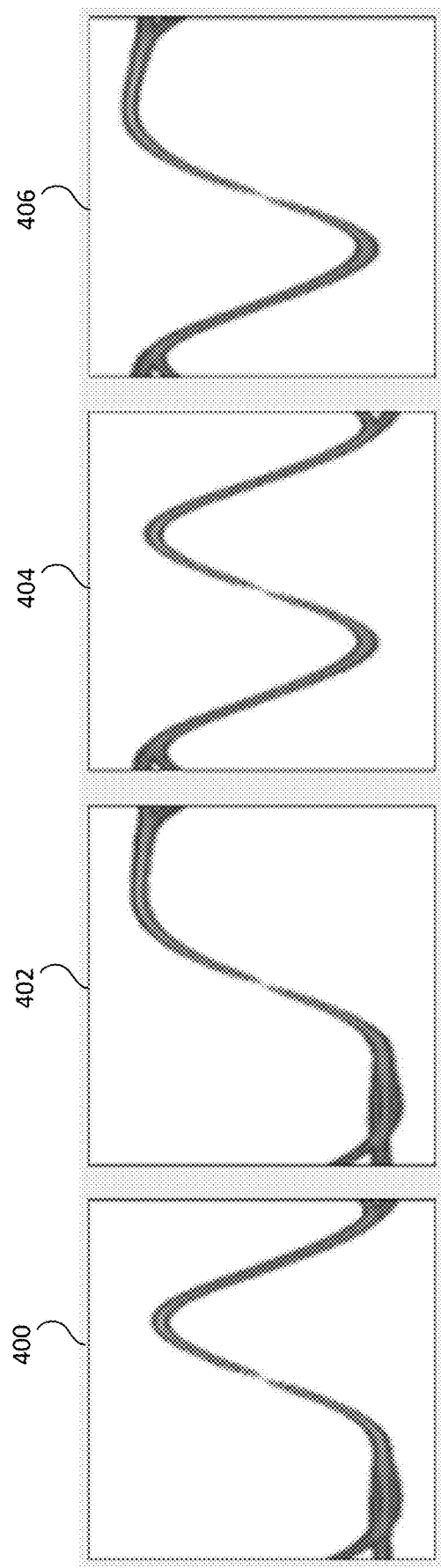
FIG. 4 is an example of multiple logical path segments detected in the overlaid rising edge measurements of FIG. 3 according to embodiments of the disclosure.

The one or more processors 104 can then automatically separate the overlaid waveforms into logical path segments and/or bit patterns, as illustrated in FIG. 4. That is, using various methods discussed below, the one or more processors 104 can automatically separate the measurement population 300 into logical path segments shown. The scale of the measurement population 300 can change and the one or more processors 104 can automatically adjust the logical path segments based on the scale of the measurement population 300.

As seen in FIG. 4, the one or more processors 104 have determined that the measurement population 300 is composed of four logical path segments 400, 402, 404, and 406. Logical path segment 400 maps to a transition 0010, logical path segment 402 maps to a transition 0011, logical path segment 404 maps to a transition 1010, and logical path segment 406 maps to a transition 1011. These are the only possible rising edge transitions in this data record shown by the measurement population 300. While FIGS. 3 and 4 illustrate a rising edge measurement, each type of measurement will have its unique, representative waveform logical path segment. Each of the rising edge logical path segments 400, 402, 404, and 406 will have an impact on the final rise measurement result.

Figure 5:
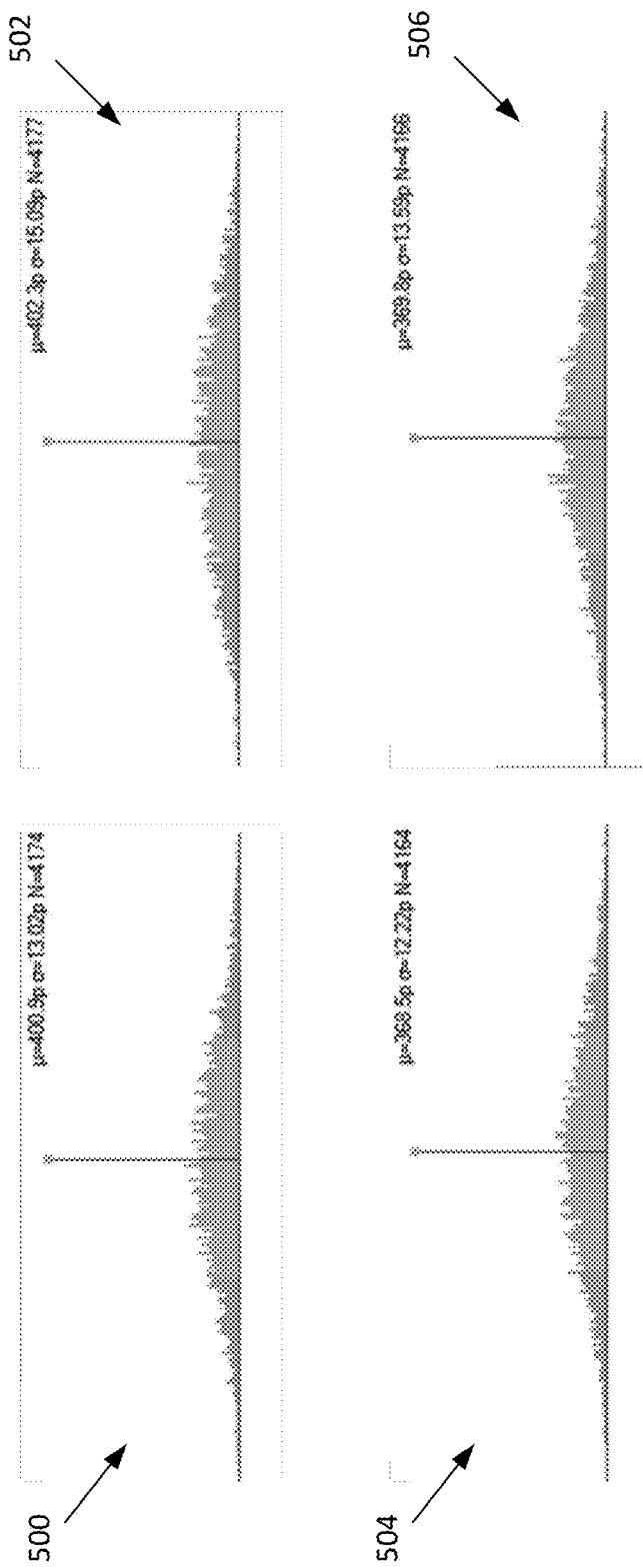
FIG. 5 is an example of histograms for each of the logical path segments depicted in FIG. 4.

FIG. 5 illustrates a respective histogram 500, 502, 504, and 506 for each of the logical path segments 400, 402, 404, and 406. The one or more processors 104 can generate a histogram for each respective logical path segment shown. If combined, the histograms 500, 502, 504, and 506 would result in the histogram 200 of FIG. 2. The histograms 500 and 502, which correspond to logical path segments 400 and 402, have a resulting means µ around 400 picoseconds (pS), while the histograms 504 and 506, which correspond to logical path segments 404 and 406, have a resulting means µ near 370 pS.

As with the measurement population and logical path segments, the histograms may be displayed to a user on the display 108. This information may be beneficial to the user and can explain to the user the distribution of the histogram 200 in FIG. 2. The user may be able to use this information to then further debug their device under test.

As shown in FIGS. 2-5, embodiments of the disclosure allow a user to interact with large measurement populations to help generate insight into the cause of apparent measurement oddities. As mentioned above, measurements are made on ever occurrence of a waveform. Each measurement take on each occurrence of the waveform contains the location (including begin, end, and focus, and the measurement value itself. In the example of a rising edge measurement, the begin value is the start of the rise, the end is the end of the rise, the focus is the mid crossing point, and the value is the difference between the end value and the begin value.

Figure 6:
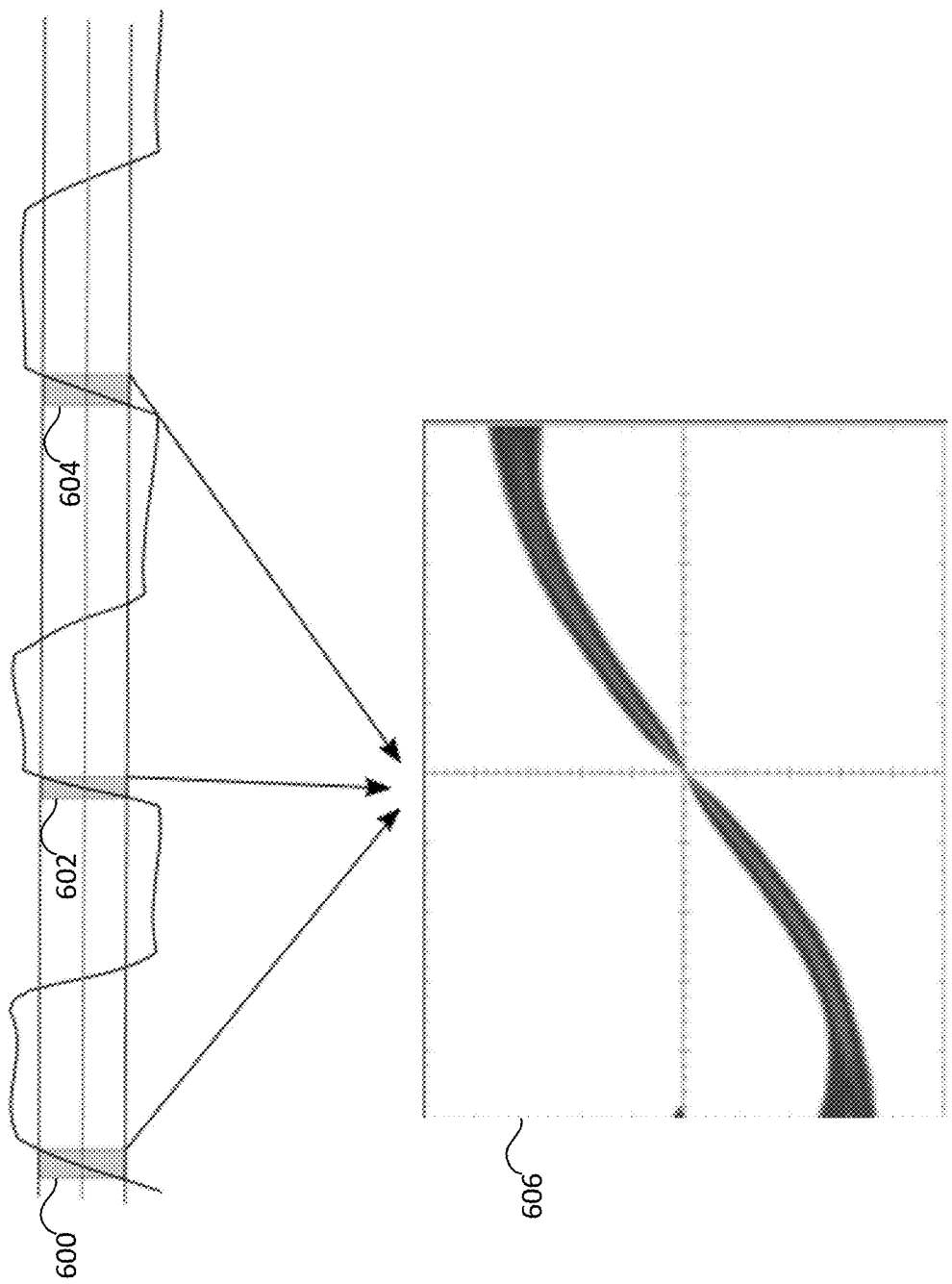
FIG. 6 is an illustration of an example method of overlaying multiple rising edge measurements according to some embodiments of the disclosure.

FIG. 6 illustrates how a measurement on every occurrence is overlaid to generate a visual representation of the population of the waveforms representing the measurement. As illustrated in FIG. 6, each of the segments 600, 602, and 604 associated with a measurement, in this instance a rising edge measurement, are overlaid in a waveform database, and the one or more processors 104 can generate a visual representation 606 of the population of the waveforms representing the measurement. On the display 108, a scale of the visual representation of the population of the waveforms representing the measurement may be modified to show more or less of the waveform segments associated with the measurement. For example, a horizontal or vertical scale may be changed.

The one or more processors 104 may automatically identify the waveform logical path segments that are located in the displayed population of the waveforms representing the measurement. As mentioned above, if the scale of the displayed population of the waveforms representing the measurement is changed, the one or more processors 104 can determine the new logical path segments based on the amount of the measurement population being displayed.

In some embodiments, the one or more processors 104 may use machine-learning or pattern recognition to automatically detect and separate the various waveform logical path segments present in the measurement population. For example, in some embodiments, machine-learning or pattern recognition may be implemented by plotting the mean versus slope of each of the measurements and then using a machine-learning processor to associate clusters to determine the different logical path segments of the measurement population.

Figure 7:
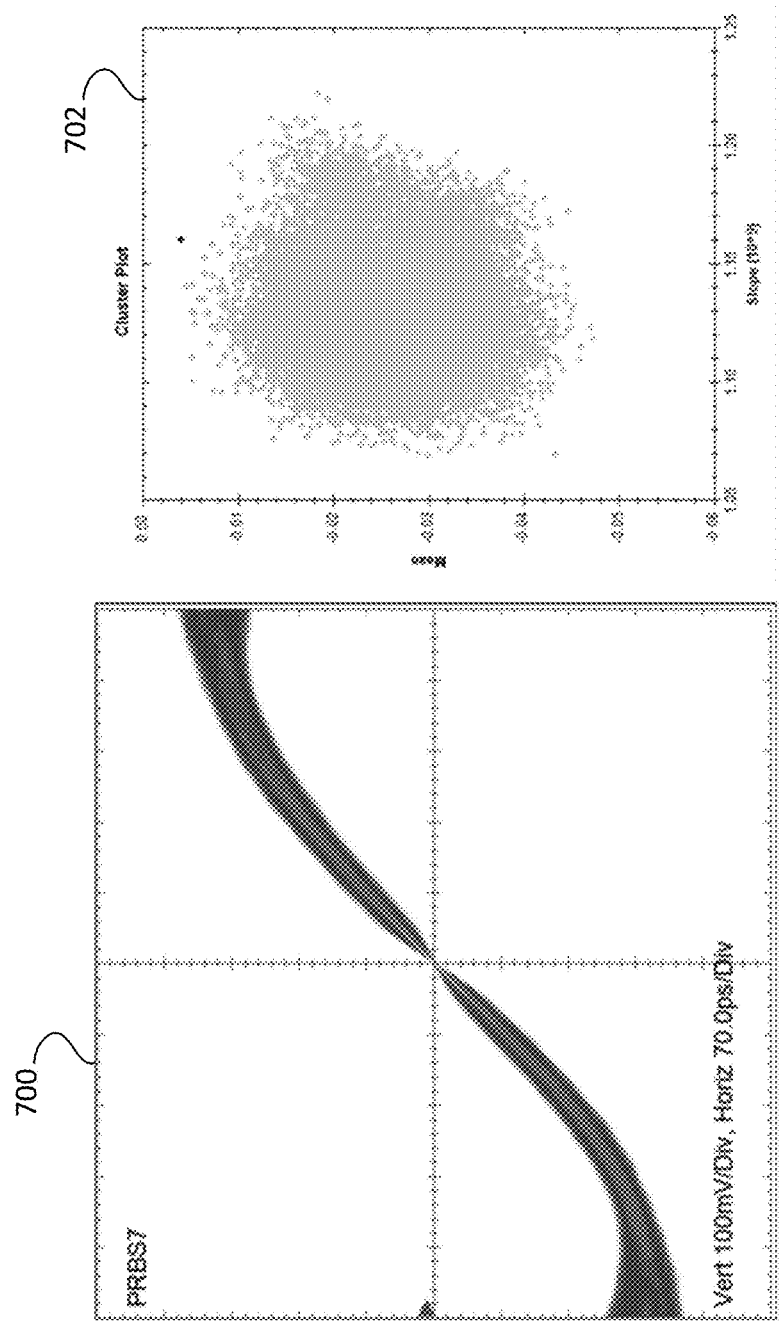
FIG. 7 is an illustration of how a logical path segment may be determined according to embodiments of the disclosure.

For example, in FIG. 7, the measurement population 700 is shown at 70 pS, where only one logical path segment is detected, as shown by cluster plot 702. All of the measurements shown in this view of the measurement population 700 are clustered together, and therefore only one logical path segment is detected by the machine-learning processor, which is included with the one or more processors 104.

Figure 8:
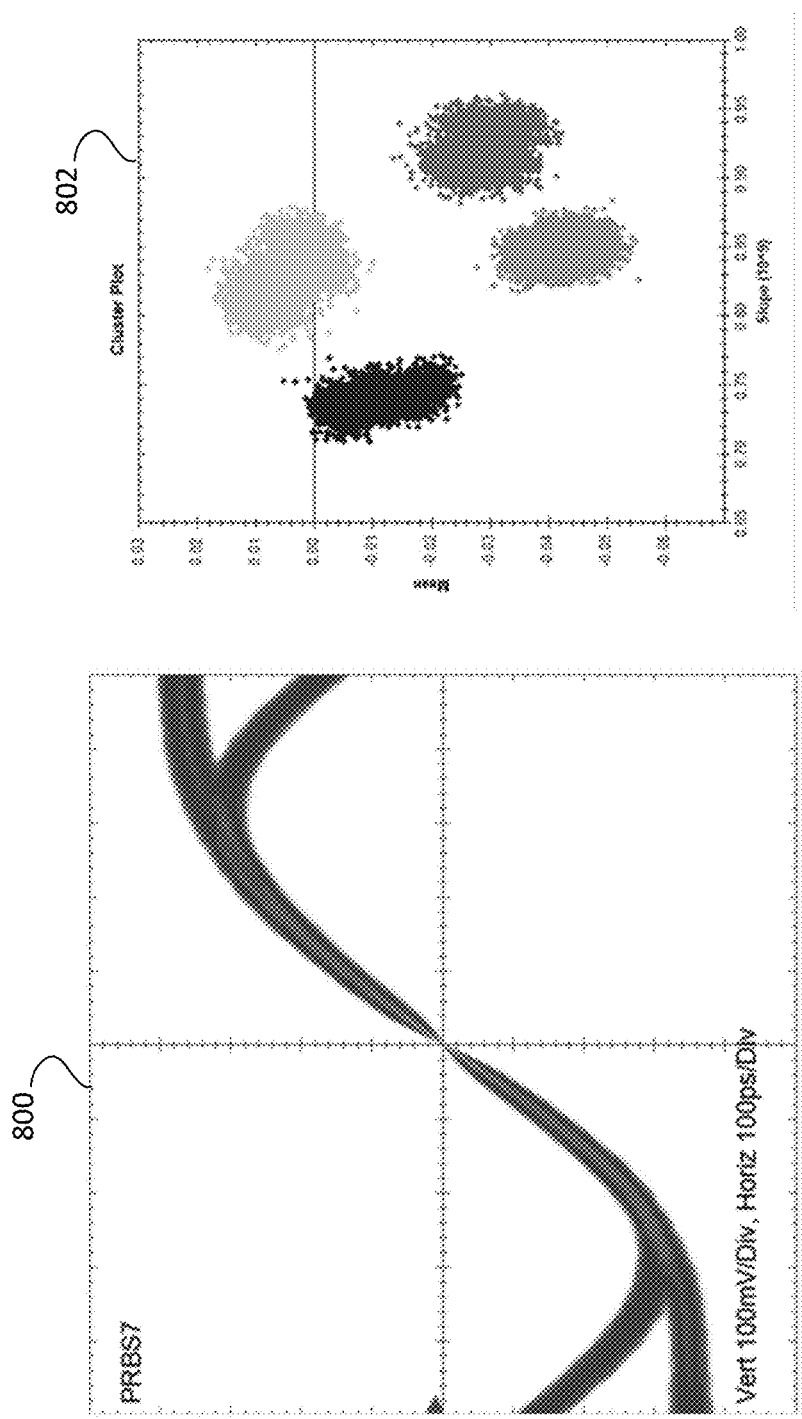
FIG. 8 is an illustration of how a logical path segment may be determined according to embodiments of the disclosure.
Figure 9:
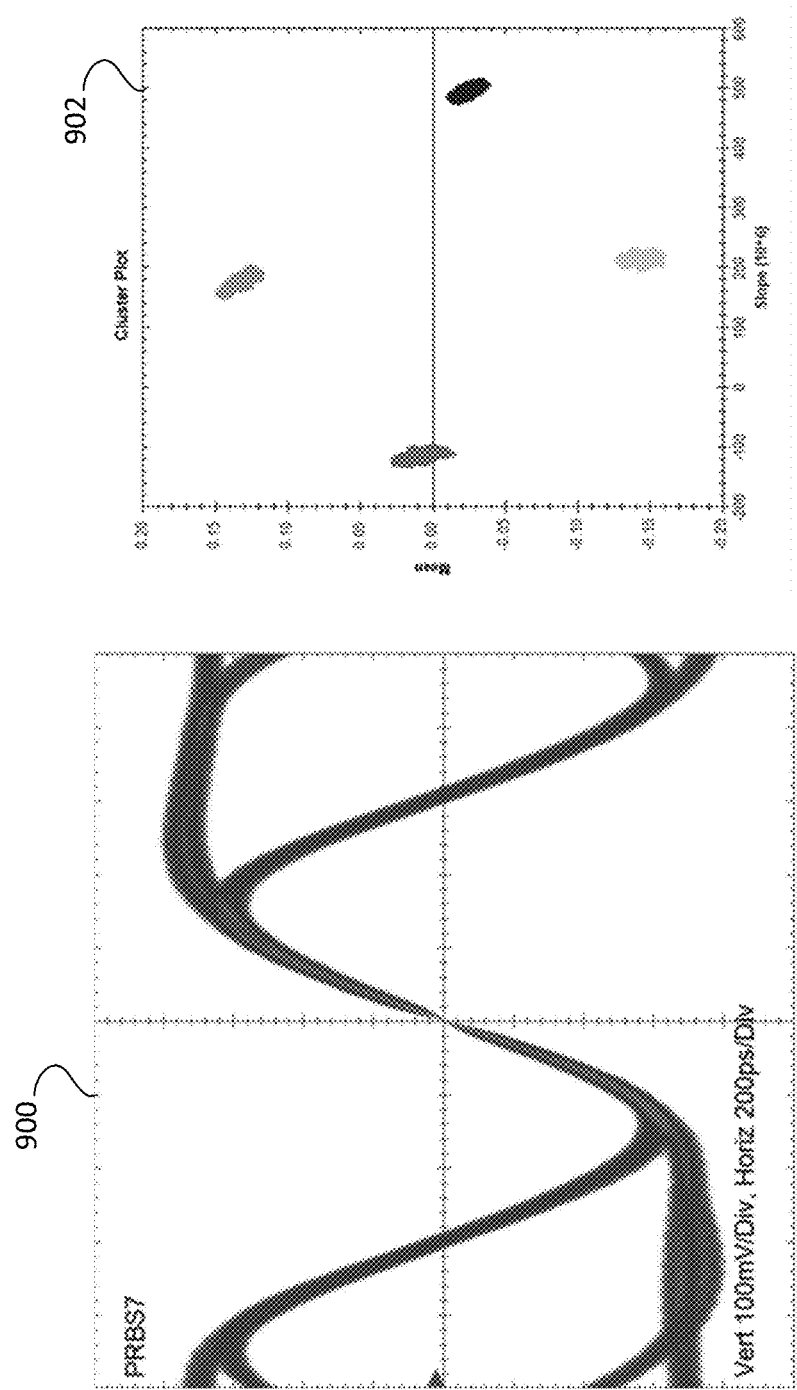
FIG. 9 is an illustration of how a logical path segment may be determined according to embodiments of the disclosure.
Figure 10:
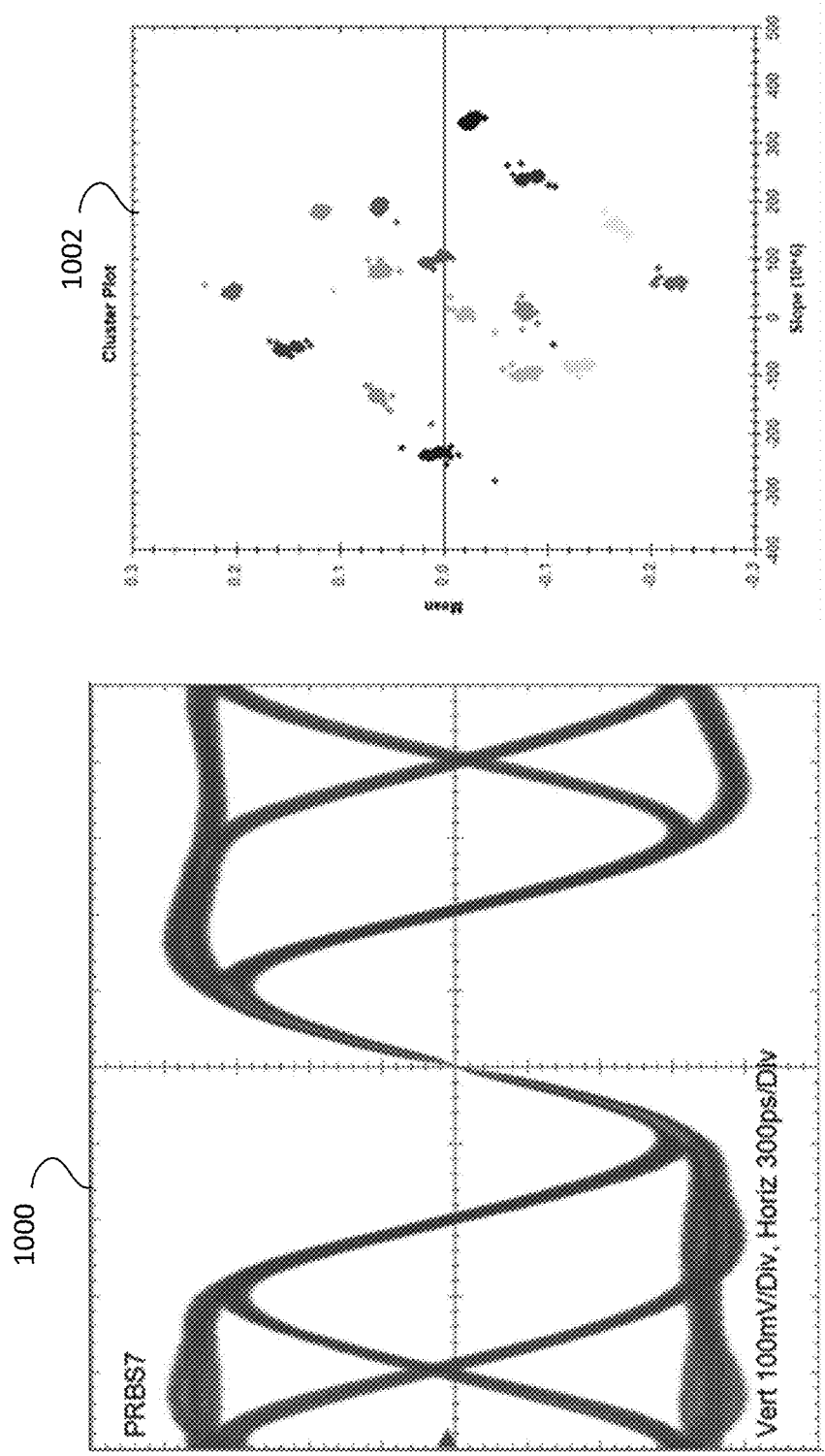
FIG. 10 is an illustration of how a logical path segment may be determined according to embodiments of the disclosure.

In FIG. 8, a measurement population 800 is shown at 100 pS and the cluster plot 802 indicates that there are four different logical path segments now visible in the measurement population 800. As more of the measurement population 900 becomes visible, as seen in FIG. 9 showing the measurement population 900 at 200 pS, the machine-learning processor is able to detect much more clearly the four different logical path segments shown in the measurement population 900. FIG. 10 illustrates an even larger portion of the measurement population 1000 at 300 pS, and the cluster plot 1002 illustrates more than sixteen logical path segments being shown by the machine-learning processor.

Figure 11:
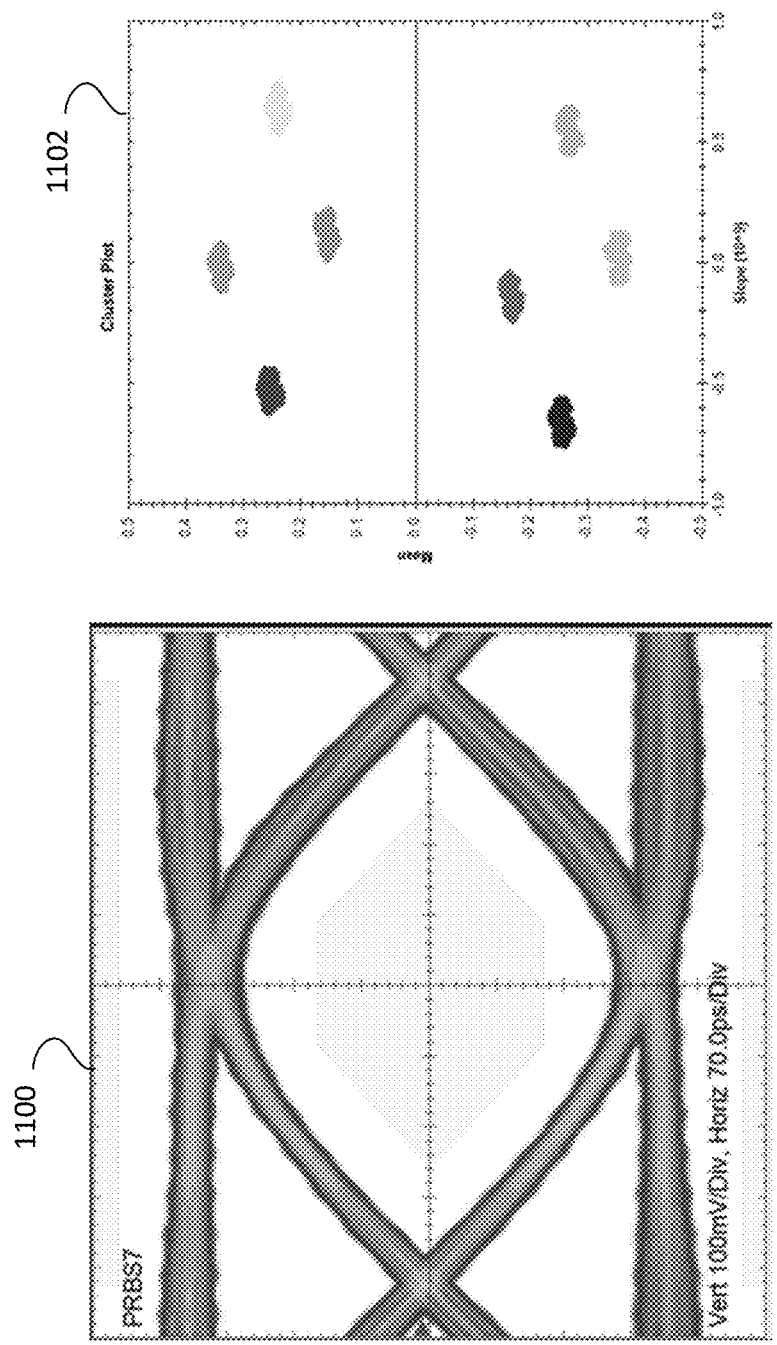
FIG. 11 an illustration of how a logical path segment may be determined according to embodiments of the disclosure.

The mean and slope cluster plots and machine-learning processor may be used for other types of waveforms as well. For example, FIG. 11 illustrates a measurement population 1100 of an eye diagram, and the machine-learning processor, through the cluster plot 1102 is able to determine there are 8 different logical path segments present in the measurement population 1100.

In some embodiments, the machine-learning processor may determine the logical path segments by using a density based algorithm. This technique can work well with relatively small population measurements, but may become slow with large populations found in even modest waveform record lengths. Accordingly, in other embodiments, the machine-learning processor can use a grid based algorithm. Gridding is the process of using the slope as an x-axis and means as the y-axis. The minimum and maximum values for each dimension define the range of rows and columns. A specified number of cells may be defined for each axis, and each row and column cell is a list of waveform segment paths.

The machine-learning processor can put slope and mean waveform segment paths together into associated grid locations and clumps are combined by combining adjacent grid cells. This can be done quickly by the machine-learning processor, and can allow for coarse or fine adjustment in the grouping behavior by changing the number of rows and/or columns in the grid. Further, minimum density used as a threshold for an occupied space may be changed, so that a user can opt to discard rarely occurring information which can help the machine-learning processor to separate tightly-packed clusters.

When a measurement population, as generated by the one or more processors 104 is displayed on the display 108, the one or more processors 104 can also automatically generate each of the logical path segments shown in the measurement population that is displayed as thumbnail images below the measurement population on the display 108. A user may then select any one of the logical path segment thumbnail depictions to view the logical path segment in further detail in the larger graticule.

Figure 12:
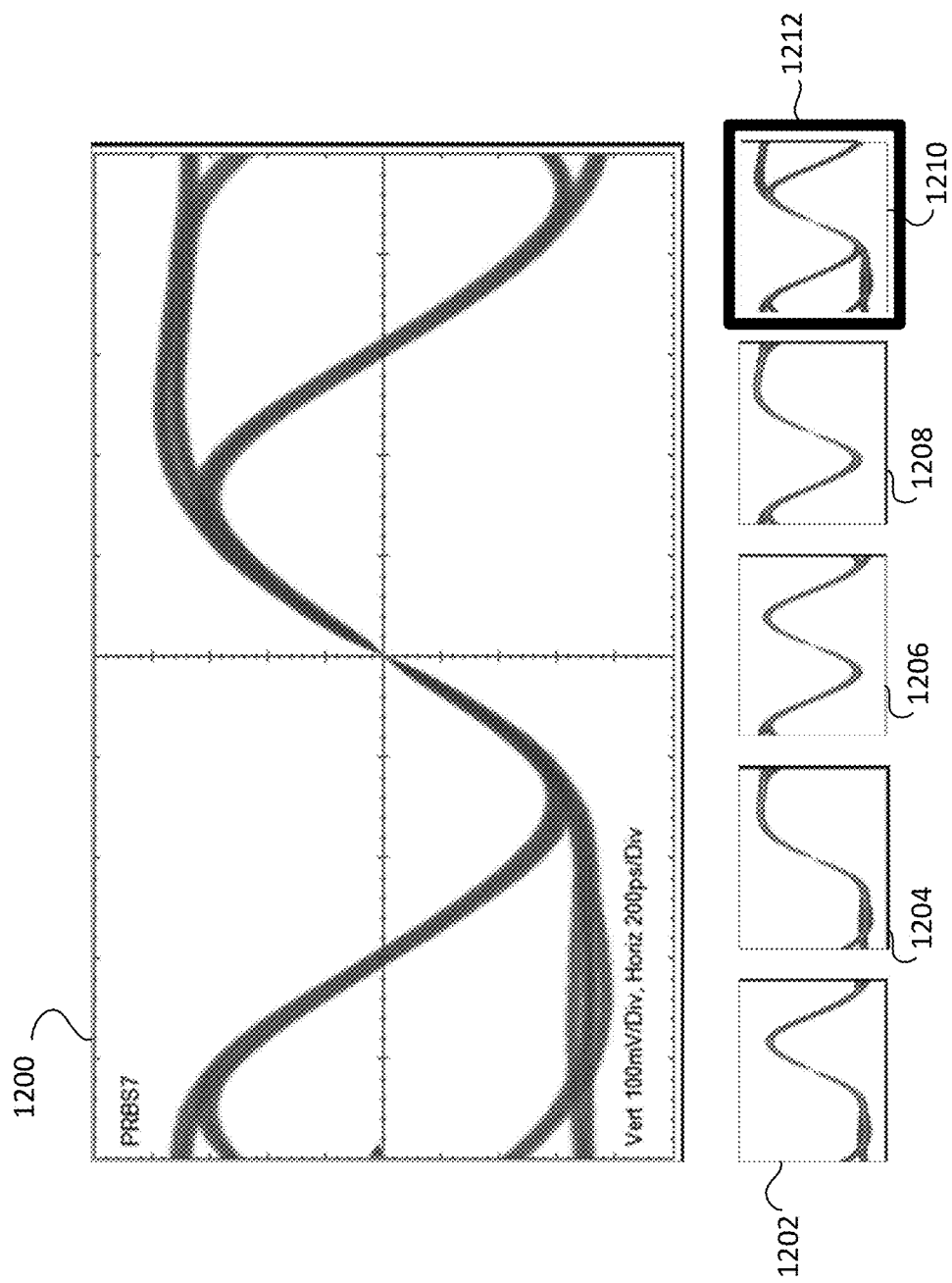
FIG. 12 is an example of a graphical user interface displayed on the display according to embodiments of the disclosure.

For example, FIG. 12 illustrates an example graphical user interface (GUI) of the display 108 when a measurement population is generated and displayed in a graticule 1200. Below the measurement population 1200 is a thumbnail 1202, 1204, 1206, and 1208 for each of the logical path segments that were automatically detected by the machine learning processor from the measurement population 1200. A thumbnail 1210 of the measurement population may also be shown and may be highlighted, such as by a box 1212, to a user to indicate that the measurement population in the thumbnail 1210 corresponds to the graticule 1200.

Figure 13:
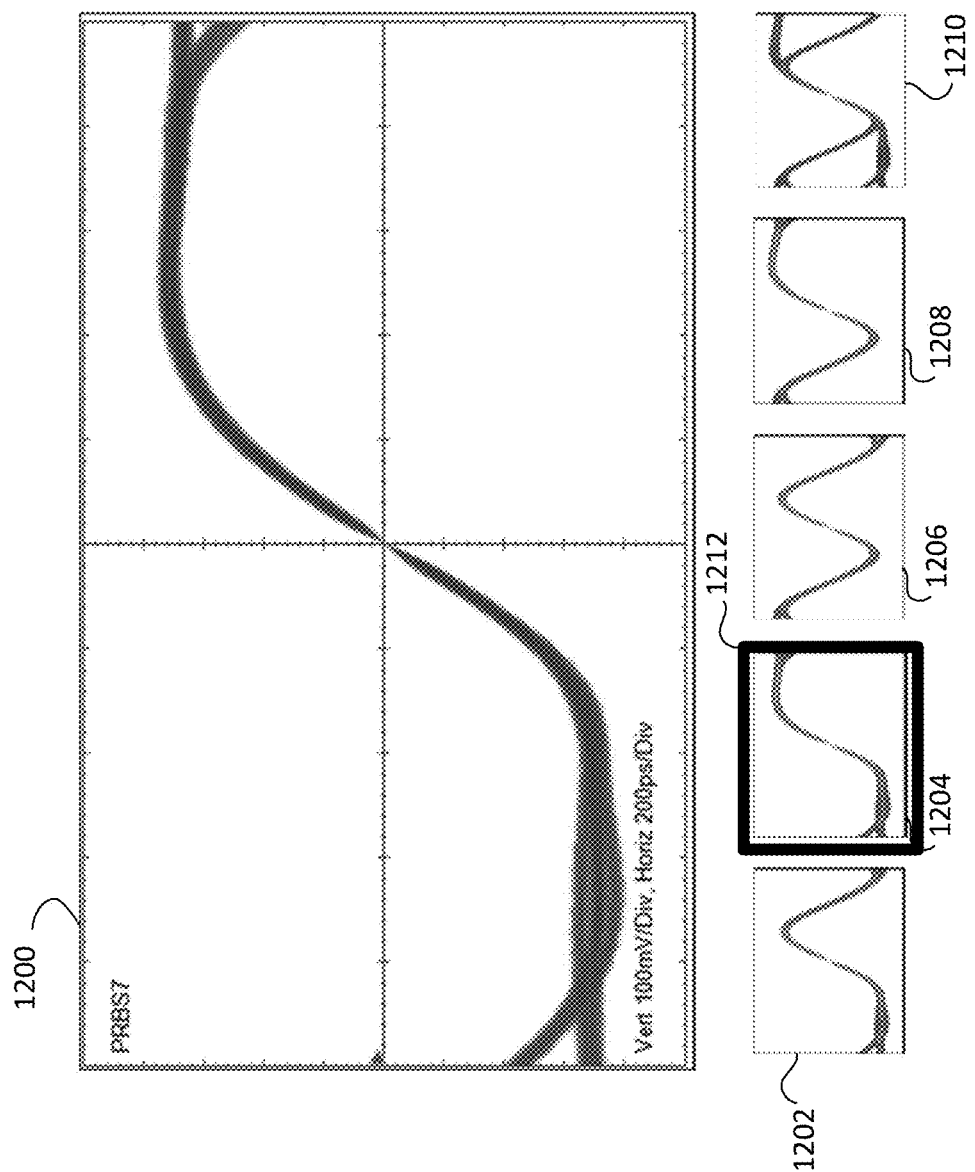
FIG. 13 is another example of a graphical user interface displayed on the display according to embodiments of the disclosure.

As seen in FIG. 13, when thumbnail 1204 is selected, then the logical path segment depicted in thumbnail 1204 is displayed in the graticule 1200. A user may then further analyze this logical path segment, as desired. In some embodiments, a measurement result can be associated with each thumbnail, so that each logical path segment can be more easily compared. For example, the logical path segments may be sorted in the rising edges of a measurement by transition to help identify problem logical path segments. This may be particularly useful when a large number of logical path segments are present in the measurement population.

Figure 14:
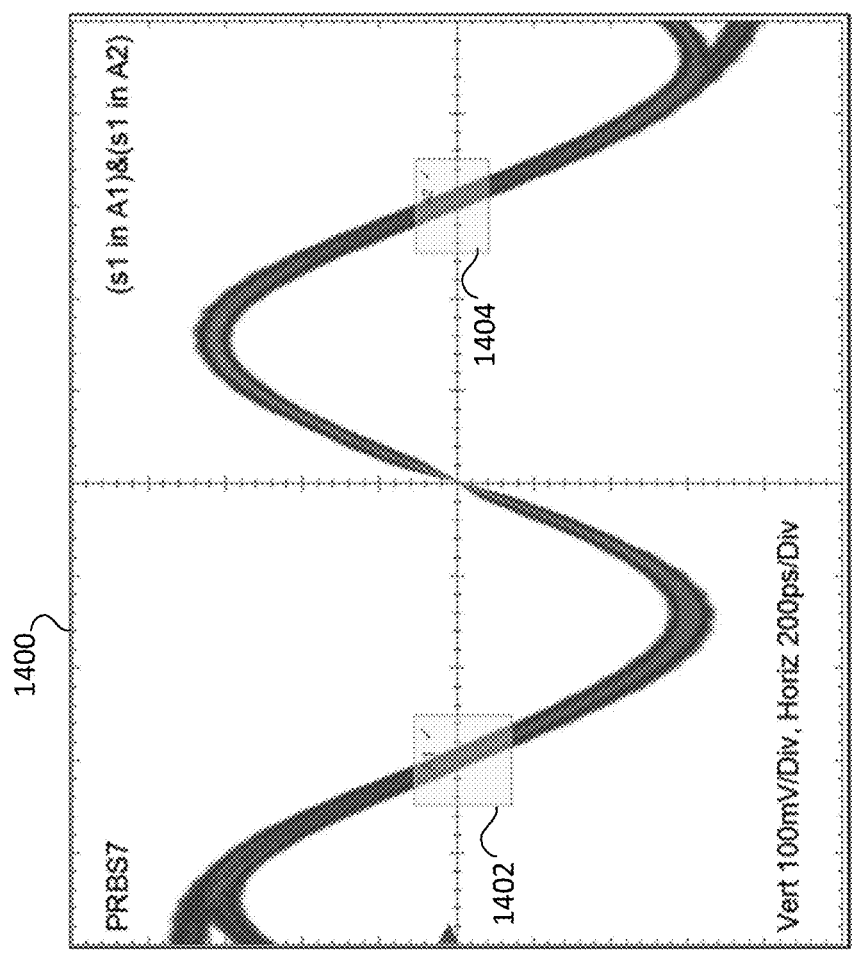
FIG. 14 is an example of using a trigger-like interaction with a graphical user interface to filter a measurement population according to some embodiments of the disclosure.

In some embodiments, a measurement population may be manually filtered via user inputs 110 with visual trigger-like user interface interactions. For example, as seen in FIG. 14, a user may draw a box 1402 and 1404 or any other barrier using user inputs 110 around portions of the measurement population shown in graticule 1400 the user is interested in viewing. As can be seen in FIG. 14, only the logical path segments that fall within each of the boxes 1402 and 1404 is shown on the display 108. If one of the boxes 1402 and 1404 is removed, then the measurement population may automatically be updated again to reflect the new singular trigger box.

In some embodiments, when one or more trigger boxes are added to the measurement population, the measurement population is automatically updated in a main graticule on the display 108 to only include the logical path segments that are within the trigger boxes. Although not depicted in FIG. 14, a thumbnail may also be provided below the main graticule for each of the logical path segments that are present in the updated measurement population. In some embodiments, a thumbnail for the complete measurement population with all the logical path segments shown may also be shown, so that a user may easily select and revert back to the original population measurement without having to delete the trigger boxes 1402 and 1404.

Figure 15:
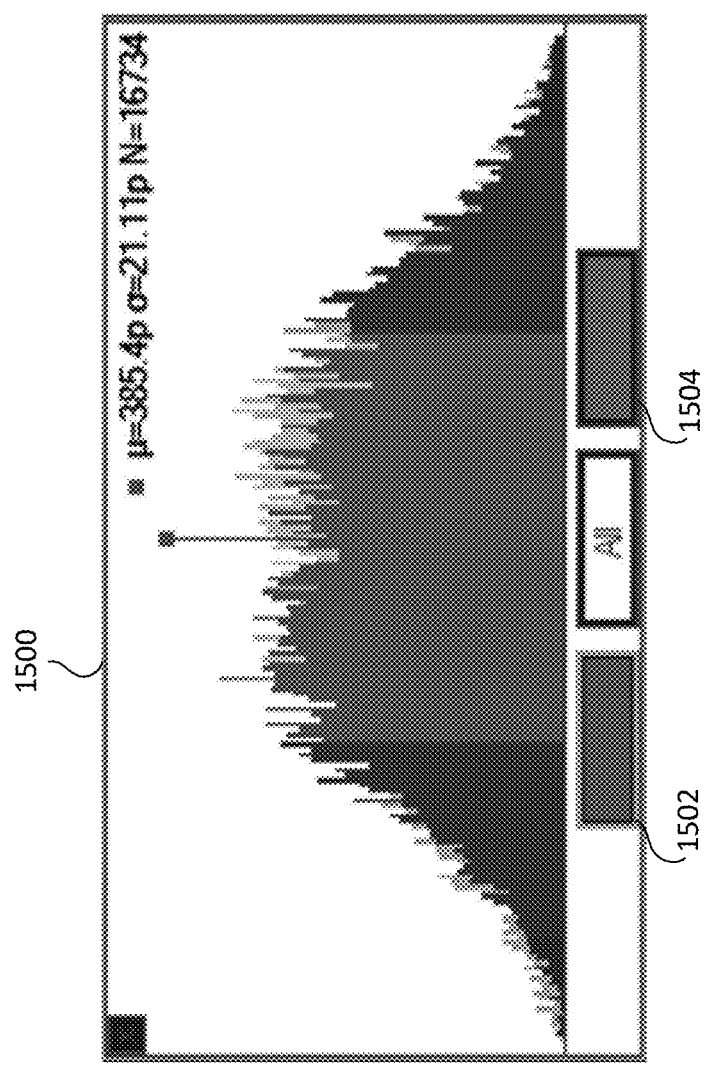
FIG. 15 is an example of a histogram that can be generated according to some embodiments of the disclosure.

As seen in FIG. 15, if a user notices an anomaly and wishes to further investigate the anomaly, a user may select to view histograms of different measurement values overlaid each other to gain knowledge about their relationship and/or a relationship of a measurement value to the whole. For example, FIG. 15 illustrates a histogram 1500 which includes both rising edge measurements 1502 and falling edge measurements 1504.

Figure 16:
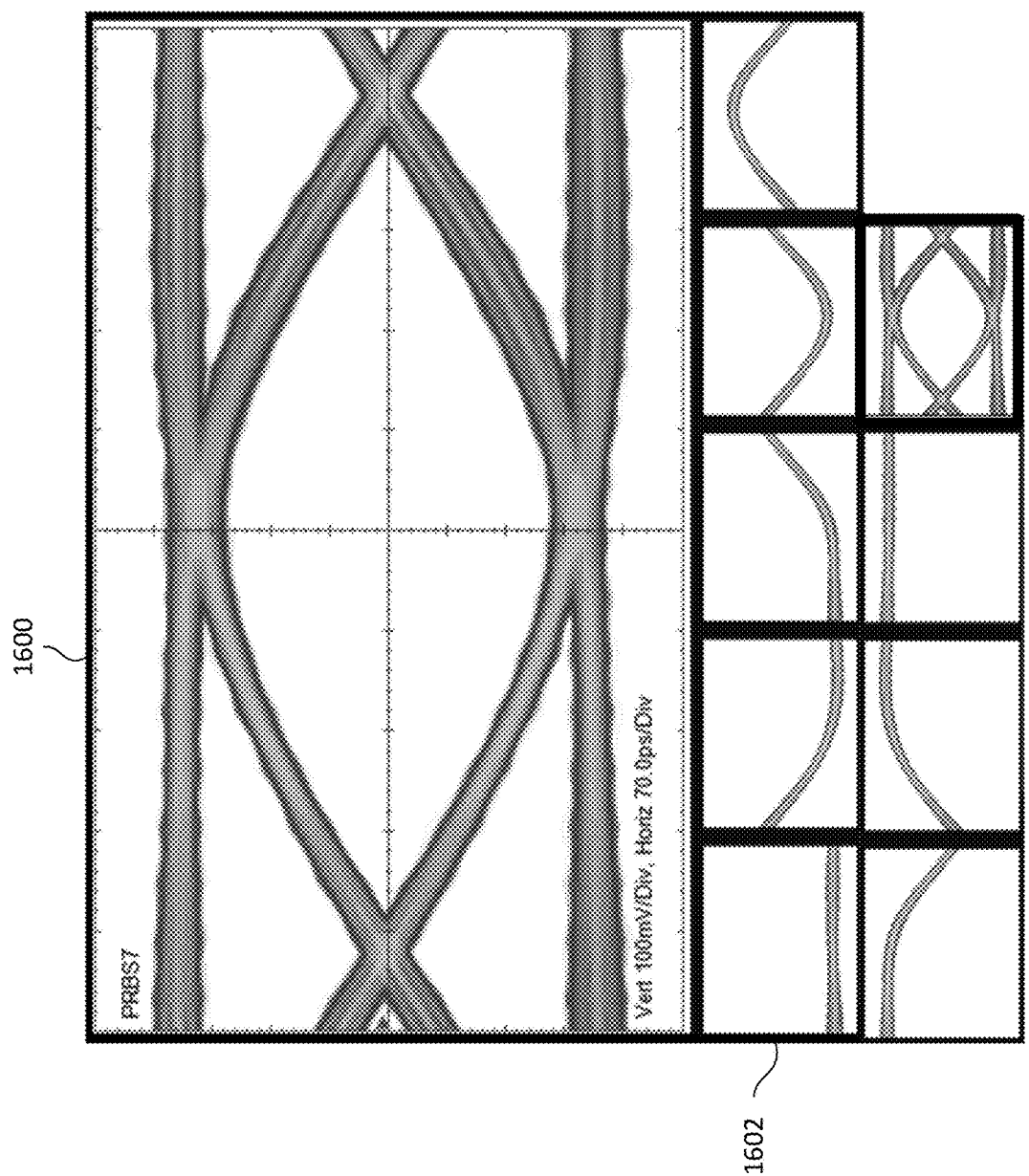
FIG. 16 is another example of a graphical user interface displayed on the display according to embodiments of the disclosure.

FIG. 16 is an example of a graphical user interface for displaying a measurement population. In FIG. 16, a main graticule 1600 includes an eye diagram generated by the one or more processors 104 using a waveform data record. Eye diagrams are a commonly used statistical method for visualizing and analyzing the behavior of a serial bus.

The one or more processors 104 may then automatically detect the various logical path segments located in the eye diagram and display each of the logical path segments as thumbnails 1602. The thumbnails 1602 may be selected by a user through the user inputs 110 and the main graticule 1600 can then display the selected thumbnail 1602 for a user to more closely analyze the selected logical path segment.

Figure 17:
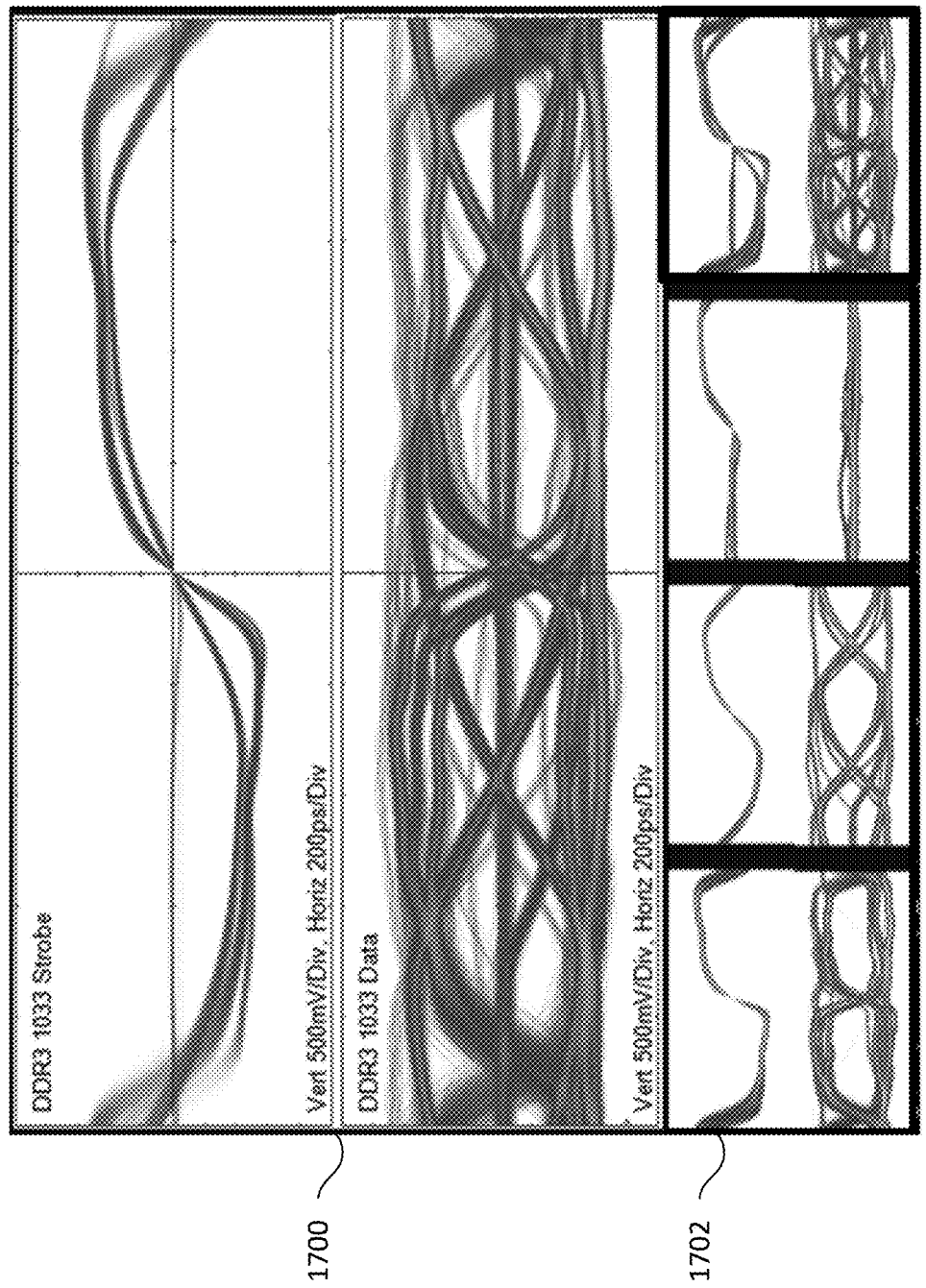
FIG. 17 is another example of a graphical user interface displayed on the display according to embodiments of the disclosure.

The one or more processors 104 are not limited to generating and displaying on the display 108 a single measurement population. For example, in FIG. 17, a graticule 1700 is shown with a strobe and data pair waveforms. The one or more processors 104 can generate measurement populations of the strobe and data pair waveforms. To do this, the one or more processors 104 can detect the logical path segments of the strobe waveform, using techniques discussed above, and the data waveforms can be drawn from the timing information from those paths to easily see the relationship between the strobe and data waveforms. Thumbnails 1702 can be provided to show the different logical path segments of the strobe waveform. And as discussed above with respect to other embodiments, the thumbnails 1702 can be selected and displayed in the main graticule 1700 for further analysis or viewing by a user.

Figure 18:
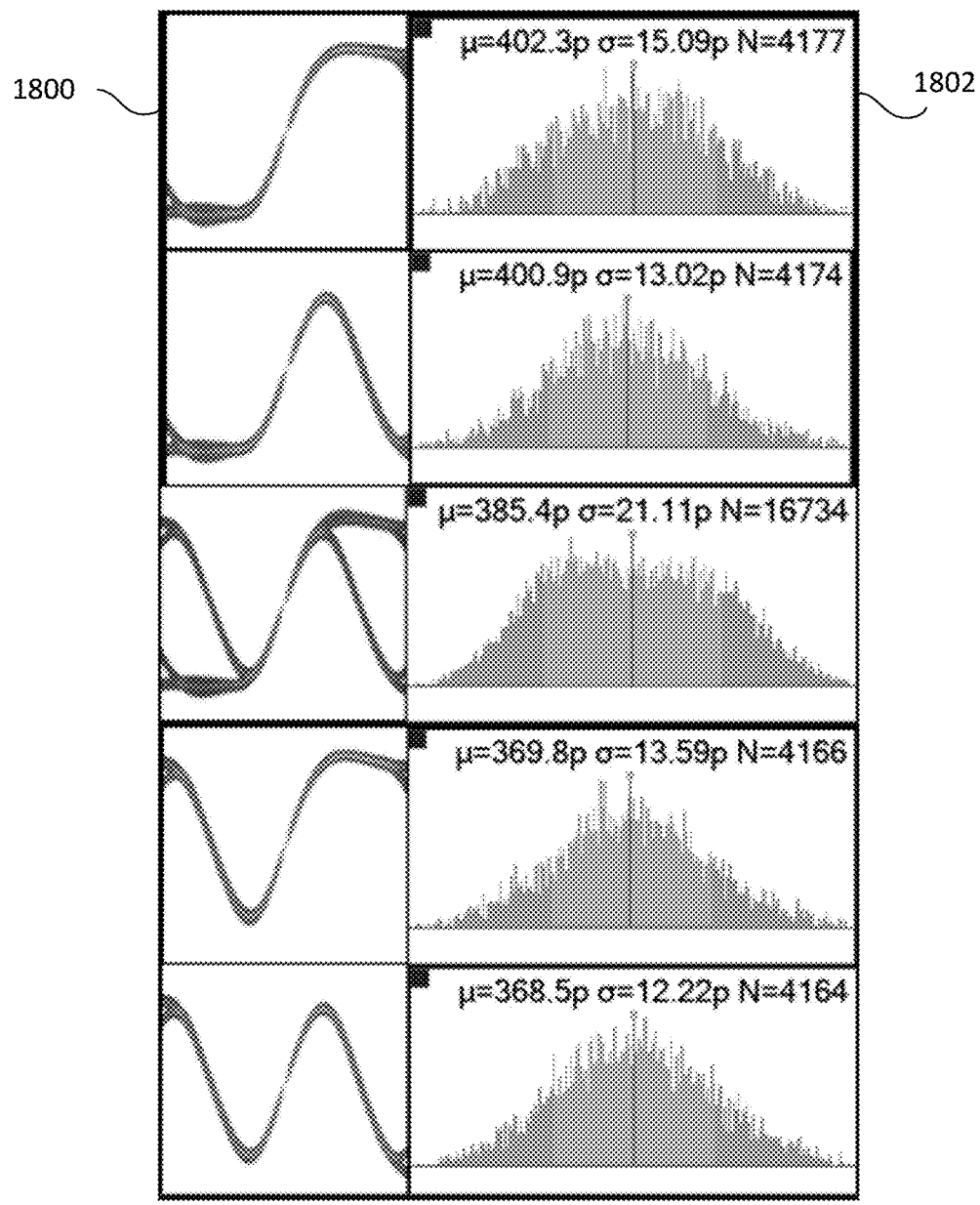
FIG. 18 is another example of a graphical user interface displayed on the display according to embodiments of the disclosure.

In some embodiments, a user can select an alternative view of the data. For example, rather than having a main graticule as discussed above in some of the embodiments, the measurement population and each of the logical path segments may be shown in their own graticule 1800 along with the associated measurement. For example, as seen in FIG. 18, the logical path segments and the measurement population are each shown in a graticule 1800 and an adjacent to each graticule is a histogram 1802 of the rising edge measurement.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising a memory configured to store a waveform data record; one or more processors configured to receive the waveform data record, determine a measurement value and location for a plurality of occurrences of a measurement event in the waveform data record, detect one or more logical path segments in the plurality of occurrences, and generating a visual representation of each measurement value and overlaying each of the visual representations of each measurement value; and a display configured to display the visual representations of the measurement values.

Example 2 is the test and measurement instrument of example 1, wherein the one or more processors are further configured to separate each of the one or more logical path segments and the display is further configured to display each of the logical path segments.

Example 3 is the test and measurement instrument of example 2, wherein the display is further configured to display each of the logical path segments concurrently with the visual representations of the measurement values.

Example 4 is the test and measurement instrument of any one of examples 1-3, wherein the one or more processors are configured to detect the one or more logical path segments by pattern recognition.

Example 5 is the test and measurement instrument of example 4, wherein the pattern recognition includes generating a grid based on each of the measurement values and grouping similar adjacent grid cells.

Example 6 is the test and measurement instrument of example 4, wherein the pattern recognition includes associating measurement values using a density analysis.

Example 7 is the test and measurement instrument of any one of examples 1-6, further comprising a user input, wherein the one or more processors are further configured to filter the detected one or more logical path segments based on the user input.

Example 8 is the test and measurement instrument of any one of examples 1-7, wherein the measurement value is one of a rising edge measurement, a falling edge measurement, a rising and falling edge measurement, an edge measurement, a long bit measurement, or a custom measurement.

Example 9 is the test and measurement instrument of any one of examples 1-8, wherein the measurement value is a first measurement value, and the one or more processors are further configured to generate a histogram based on the first measurement value and a second measurement value different from the first measurement value.

Example 10 is a method for automatically detecting logical path segments in a measurement population, comprising determining a measurement value and location for a plurality of occurrences of a measurement event in a waveform data record; detecting one or more logical path segments in the plurality of occurrences; generating a visual representation of each measurement value and overlaying each visual representation of each measurement value; and displaying on a display each visual representation of each measurement value.

Example 11 is the method of example 10, further comprising: separating each of the one or more logical path segments; and displaying each of the logical path segments.

Example 12 is the method of example 11, further comprising displaying each of the logical path segments concurrently with the visual representation of each measurement value.

Example 13 is the method of any one of examples 10-12, further comprising detecting the one or more logical path segments by pattern recognition.

Example 14 is the method of example 13, wherein the pattern recognition includes generating a grid based on each of the measurement values and grouping similar adjacent grid cells.

Example 15 is the method of example 13, wherein the pattern recognition includes associating measurement values using a density analysis.

Example 16 is the method of any one of examples 10-15, further comprising filtering the detected one or more logical path segments based on a user input.

Example 17 is the method of any one of examples 10-16, wherein the measurement value is one of a rising edge measurement, a falling edge measurement, a rising and falling edge measurement, an edge measurement, a long bit measurement, or a custom measurement.

Example 18 is one or more computer-readable storage media comprising instructions, which, when executed by one or more processors of a test and measurement instrument, cause the test and measurement instrument to determine a measurement value and location for a plurality of occurrences of a measurement event in a waveform data record; detect one or more logical path segments in the plurality of occurrences; generate a visual representation of each measurement value and overlaying each of the visual representation of each measurement value; and display on a display the overlaid visual representation of each measurement value.

Example 19 is the one or more computer-readable storage media of example 18, further including instructions that cause the test and measurement instrument to display each of the logical path segments concurrently with the overlaid visual representation.

Example 20 is the one or more computer-readable storage media of any one of examples 18 and 19, wherein the measurement value is one of a rising edge measurement, a falling edge measurement, a rising and falling edge measurement, an edge measurement, a long bit measurement, or a custom measurement.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
a memory configured to store a waveform data record;
one or more processors configured to:
receive the waveform data record,
determine a measurement value and location for a plurality of occurrences of a measurement event in the waveform data record,
detect one or more logical path segments associated with the measurement values for the plurality of occurrences of the measurement event, and
generate a visual representation of each measurement value and overlay each of the visual representations of each measurement value; and
a display configured to display the visual representations of the measurement values.

2. The test and measurement instrument of claim 1, wherein the one or more processors are further configured to separate each of the one or more logical path segments and the display is further configured to display each of the logical path segments.

3. The test and measurement instrument of claim 2, wherein the display is further configured to display each of the logical path segments concurrently with the visual representations of the measurement values.

4. The test and measurement instrument of claim 1, wherein the one or more processors are further configured to detect the one or more logical path segments by pattern recognition.

5. The test and measurement instrument of claim 4, wherein the pattern recognition includes generating a grid of cells based on each of the measurement values, and grouping similar adjacent grid cells.

6. The test and measurement instrument of claim 4, wherein the one or more processors are further configured to detect the one or more logical path segments by pattern recognition by associating the measurement values using a density analysis.

7. The test and measurement instrument of claim 1, further comprising a user input, wherein the one or more processors are further configured to filter the detected one or more logical path segments based on the user input.

8. The test and measurement instrument of claim 1, wherein the measurement event is one of a rising edge measurement, a falling edge measurement, a rising and falling edge measurement, an edge measurement, a long bit measurement, or a custom measurement.

9. The test and measurement instrument of claim 1, wherein the measurement event is a first measurement event, and the one or more processors are further configured to generate a histogram of measurement values associated with the first measurement event, determine a measurement value and location for a plurality of occurrences of a second measurement event in the waveform data record different from the first measurement event, and generate a second histogram of measurement values associated with the second measurement event.

10. A method for automatically detecting logical path segments in a measurement population, comprising:
   determining a measurement value and location for a plurality of occurrences of a measurement event in a waveform data record;
   detecting one or more logical path segments associated with the measurement values for the plurality of occurrences of the measurement event;
   generating a visual representation of each measurement value and overlaying each visual representation of each measurement value; and
   displaying on a display each visual representation of each measurement value.

11. The method of claim 10, further comprising:
   separating each of the one or more logical path segments; and
   displaying each of the logical path segments.

12. The method of claim 11, further comprising displaying each of the logical path segments concurrently with the visual representation of each measurement value.

13. The method of claim 10, wherein detecting the one or more logical path segments comprises pattern recognition.

14. The method of claim 13, wherein the pattern recognition includes generating a grid of cells based on each of the measurement values, and grouping similar adjacent grid cells.

15. The method of claim 13, wherein the pattern recognition includes associating the measurement values using a density analysis.

16. The method of claim 10, further comprising filtering the detected one or more logical path segments based on a user input.

17. The method of claim 10, wherein the measurement event is one of a rising edge measurement, a falling edge measurement, a rising and falling edge measurement, an edge measurement, a long bit measurement, or a custom measurement.

18. One or more non-transitory computer-readable storage media comprising instructions, which, when executed by one or more processors of a test and measurement instrument, cause the test and measurement instrument to:
   determine a measurement value and location for a plurality of occurrences of a measurement event in a waveform data record;
   detect one or more logical path segments associated with the measurement values for the plurality of occurrences of the measurement event;
   generate a visual representation of each measurement value and overlay each of the visual representations of each measurement value; and
   display on a display the overlaid visual representations of each measurement value.

19. The one or more non-transitory computer-readable storage media of claim 18, further including instructions that cause the test and measurement instrument to display each of the logical path segments concurrently with the overlaid visual representation.

20. The one or more non-transitory computer-readable storage media of claim 18, wherein the measurement event is one of a rising edge measurement, a falling edge measurement, a rising and falling edge measurement, an edge measurement, a long bit measurement, or a custom measurement.

* * * * *